United States Patent
Wang

(10) Patent No.: US 11,641,184 B2
(45) Date of Patent: May 2, 2023

(54) FILM BULK ACOUSTIC RESONATOR

(71) Applicant: Ningbo Semiconductor International Corporation, Ningbo (CN)

(72) Inventor: Xiaochuan Wang, Shanghai (CN)

(73) Assignee: NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 345 days.

(21) Appl. No.: 17/016,887

(22) Filed: Sep. 10, 2020

(65) Prior Publication Data

US 2020/0412318 A1      Dec. 31, 2020

Related U.S. Application Data

(63) Continuation of application No. 15/390,050, filed on Dec. 23, 2016, now Pat. No. 10,784,832.

(30) Foreign Application Priority Data

Dec. 28, 2015   (CN) .......................... 201511003828.3

(51) Int. Cl.
    *H03H 9/17*      (2006.01)
    *H03H 3/02*      (2006.01)
    (Continued)

(52) U.S. Cl.
    CPC ............. *H03H 3/02* (2013.01); *H01L 41/277* (2013.01); *H03H 9/02118* (2013.01);
    (Continued)

(58) Field of Classification Search
    CPC .. H03H 9/02118; H03H 9/0504; H03H 9/171; H03H 9/173
    See application file for complete search history.

(56) References Cited

U.S. PATENT DOCUMENTS

2009/0213561 A1 * 8/2009 Mi .................... H01L 25/165
                                                                 361/782
2011/0316097 A1   12/2011 Herrin et al.
(Continued)

FOREIGN PATENT DOCUMENTS

CN   103795370 A   5/2014
CN   103873010 A   6/2014
(Continued)

*Primary Examiner* — Bryan P Gordon
(74) *Attorney, Agent, or Firm* — Anova Law Group PLLC

(57) ABSTRACT

Film bulk acoustic resonator (FBAR) is provided. An exemplary FBAR includes a substrate; a first insulating material layer on the substrate, the first insulating material layer containing a first cavity; a second insulating material layer on the first insulating material layer, the second insulating material layer containing a second cavity and a third cavity spaced apart from the second cavity, the second cavity and the third cavity both in communication with the first cavity; a resonator sheet covering the second cavity and partially extending over the second insulating material layer; a third insulating material layer over the second insulating material layer and the resonator sheet, the third insulating material layer containing a fourth cavity, the fourth cavity in communication with the third cavity, and the fourth cavity partially overlapping the second cavity; and a capping layer on the third insulating material layer.

20 Claims, 8 Drawing Sheets

(51) Int. Cl.
*H03H 9/02* (2006.01)
*H01L 41/277* (2013.01)
*H03H 9/05* (2006.01)

(52) U.S. Cl.
CPC .......... *H03H 9/0504* (2013.01); *H03H 9/171* (2013.01); *H03H 9/173* (2013.01); *H03H 2003/021* (2013.01); *Y10T 29/42* (2015.01); *Y10T 29/49005* (2015.01)

(56) References Cited

U.S. PATENT DOCUMENTS

| | | | |
|---|---|---|---|
| 2012/0075030 A1* | 3/2012 | Iwasaki | B81B 7/0077 438/689 |
| 2014/0125203 A1* | 5/2014 | Choy | H03H 9/173 310/365 |
| 2017/0207764 A1* | 7/2017 | Wang | H03H 9/02118 |
| 2019/0103852 A1* | 4/2019 | Gilbert | H03H 9/145 |

FOREIGN PATENT DOCUMENTS

| | | |
|---|---|---|
| CN | 103873010 B | 3/2017 |
| KR | 20050045673 A | 5/2005 |

* cited by examiner

FILM BULK ACOUSTIC RESONATOR

CROSS REFERENCE TO RELATED APPLICATIONS

This application is a continuation of U.S. patent application Ser. No. 15/390,050, filed on Dec. 23, 2016, which claims the priority of Chinese patent application No. 201511003828.3, filed on Dec. 28, 2015, the entirety of all of which is incorporated herein by reference.

TECHNICAL FIELD

The present disclosure relates to the field of filtering devices and, in particular, to a film bulk acoustic resonator (FBAR) and a method of fabricating the FBAR.

BACKGROUND

With the development of mobile communications technology, mobile data traffic is rising rapidly. Therefore, given the limited frequency resources and the requirement to use as fewer as possible of mobile communication devices, increasing the transmit powers of wireless power transmission devices such as wireless base station, micro base stations and repeaters, that will lead to higher requirements on the powers of filters deployed in front-end circuits of the mobile communication devices, is an issue that we have to consider.

Currently, cavity filters are typically used in wireless base stations and similar devices to provide a high power that is up to hundreds of watts in some applications. However, the filters of this type are bulky. There are also some devices using dielectric filters of an average power of 5 watts or higher, these filters are bulky too though. Due to their large sizes, neither of these two types of filters can be integrated in radio frequency (RF) front-end chips.

This shortcoming of the two types of filters can be well overcome by film bulk acoustic resonators (FBARs) based on semiconductor micro-processing. FBARs operate at high frequencies and have high power-handling capacities and high quality (Q) factors. In addition, they are small sized and are therefore more advantageous for integration.

As shown in FIG. 1, a FBAR includes a substrate 1 with a bottom cavity 10, and a resonator sheet 2 on the substrate 1 and transversely over the bottom cavity 10. The resonator sheet 2 includes a top electrode 22, a bottom electrode 21 and a piezoelectric layer 23 sandwiched between the top electrode 22 and the bottom electrode 21. Additionally, an upper portion of the resonator sheet 2 is completely housed in a top cavity 30 which is generally delimited by a cover 40 and a frame 41 both formed using an expensive vacuum packaging technique. The piezoelectric layer 23 is in general a thin piezoelectric film with a piezoelectric axis C tending to be designed as being normal to both the top electrode 22 and the bottom electrode 21 of the resonator sheet 2.

When a DC electric field is applied via the top electrode 22 and the bottom electrode 21 on top and bottom sides of the piezoelectric film in the resonator sheet 2, the piezoelectric film will deform in a manner depending on the strength of the DC electric field. When the DC electric field is reversed, the deformation of the piezoelectric film will accordingly occur in a corresponding direction. In case of an AC electric field being applied, the piezoelectric film will alternately expand and contract in accordance with alternating positive and negative half cycles of the AC electric field. This resonance will induce longitudinal acoustic waves that propagate in the direction of the C-axis and will be reflected back at interfaces of the top and bottom electrodes and air. Therefore, the sound waves oscillate forth and back within the piezoelectric film under the effect of such reflections. When an oscillation path length of the longitudinal acoustic waves within the piezoelectric film is exactly equal to an odd multiple of half the wavelength, standing wave resonance will take place.

However, during the propagation of the longitudinal acoustic waves, parasitic waves travelling transverse to the thickness direction of the piezoelectric film will also be generated due to the Poisson effect. These transverse waves propagate to boundaries where the bottom cavity 10 and the resonator sheet 2 intersect and are reflected back at the opposite direction. If these transverse waves also create standing wave resonance, the quality or Q factor of the FBAR will be significantly affected.

Therefore, the industry is now focusing on how to suppress the crosstalk from the transverse parasitic waves to the bulk acoustic wave signals travelling longitudinally along the C-axis and how to realize the integration of the FBAR with an external CMOS circuit chip. In addition, reducing processing costs of the overall system is also a core disclosure of the present disclosure.

SUMMARY OF THE DISCLOSURE

An objective of the present disclosure is to solve the problems of parasitic wave crosstalk, inability to be integrated with CMOS circuitry and high manufacturing costs arising from use of existing FBARs by presenting a film bulk acoustic resonator (FBAR) and a method of fabricating the FBAR.

To achieve this objective, the disclosure provides a method of fabricating an FBAR, including:

providing a substrate;

forming on the substrate a first sacrificial material layer and a first insulating material layer surrounding the first sacrificial material layer;

forming on the first sacrificial material layer a second sacrificial material layer, a third sacrificial material layer spaced apart from the second sacrificial material layer, and a second insulating material layer surrounding both the second sacrificial material layer and the third sacrificial material layer, wherein the second sacrificial material layer at least partially overlies the first sacrificial material layer and the third sacrificial material layer at least partially overlies the first sacrificial material layer;

forming a resonator sheet on the second sacrificial material layer such that the resonator sheet partially extends over the second insulating material layer;

forming, on the resonator sheet and the third sacrificial material layer, a fourth sacrificial material layer and a third insulating material layer surrounding the fourth sacrificial material layer, wherein the fourth sacrificial material layer partially overlies the second sacrificial material layer and the fourth sacrificial material layer partially overlies the third sacrificial material layer;

forming a capping layer; and forming an opening in the capping layer and removing the fourth sacrificial material layer, the third sacrificial material layer, the second sacrificial material layer and the first sacrificial material layer via the opening.

Additionally, in the method, projections of the fourth sacrificial material layer and the second sacrificial material layer along a direction normal to the substrate may overlap at a polygonal area with non-parallel sides.

Additionally, the method may further include, prior to forming on the substrate the first sacrificial material layer and the first insulating material layer surrounding the first sacrificial material layer: forming at least a PN junction-containing semiconductor transistor on the substrate.

The disclosure also provides another method of fabricating an FBAR, including:

providing a substrate;

forming on the substrate a first sacrificial material layer and a first insulating material layer surrounding the first sacrificial material layer;

forming a resonator sheet on the first sacrificial material layer, wherein the resonator sheet partially extends over the first insulating material layer;

forming on the resonator sheet a second sacrificial material layer and a second insulating material layer surrounding the second sacrificial material layer, wherein the second sacrificial material layer partially overlies the first sacrificial material layer, and wherein projections of the second sacrificial material layer and the first sacrificial material layer along a direction normal to the substrate overlap at a polygonal area with non-parallel sides which falls completely within the resonator sheet;

forming a capping layer; and forming an opening in the capping layer and removing the second sacrificial material layer and the first sacrificial material layer via the opening.

Accordingly, the disclosure also provides an FBAR, including:

a substrate;

a first insulating material layer on the substrate, the first insulating material layer having a first cavity;

a second insulating material layer on the first insulating material layer, the second insulating material layer having a second cavity and a third cavity spaced apart from the second cavity, the second cavity and the third cavity both in communication with the first cavity;

a resonator sheet covering the second cavity and partially extending over the second insulating material layer;

a third insulating material layer over the second insulating material layer and the resonator sheet, the third insulating material layer having a fourth cavity, the fourth cavity in communication with the third cavity, the fourth cavity partially overlapping the second cavity; and a capping layer on the third insulating material layer.

In the FBAR, projections of the fourth cavity and the second cavity along a direction normal to the substrate overlap at a polygonal area with non-parallel sides.

In the FBAR, at least a PN junction-containing semiconductor transistor may be formed on the substrate, wherein the first insulating material layer overlies the at least one PN junction-containing semiconductor transistor.

Compared to existing technologies, the methods and FBAR of the present disclosure have the following advantages:

forming the several mutually overlapped and hence connected sacrificial material layers on both sides of the resonator sheet allows the removal of these sacrificial material layers to be accomplished in a direct manner without needing to form an opening in the resonator sheet, thereby ensuring the integrity of the resonator sheet;

additionally, the polygonal overlap of the fourth and second cavities that has non-parallel sides significantly lowers the likelihood of boundary reflections of transverse parasitic waves causing standing wave resonance and thus mitigates crosstalk from the parasitic waves and minimizes its impact on the FBAR Q factor; and further, integration of the FBAR in CMOS circuitry is enabled, which enhances the integration and reliability of the whole system.

DETAILED DESCRIPTION

Film bulk acoustic resonators (FBAR) and methods of fabricating them according to various embodiments of the present disclosure will be described in greater detail with reference to the accompanying drawings. While several preferred embodiments of the disclosure are set forth below, it is to be appreciated that those of skill in the art can modify the disclosure as disclosed herein and still obtain the same beneficial results. Therefore, the following description should be construed as to be widely known by those skilled in the art rather than limiting the disclosure in any way.

In the following paragraphs, the disclosure will be described in greater detail with reference to specific examples. The advantages and features of the disclosure will become more apparent upon reading the following description and the appended claims. Note that the drawings are provided in a very simplified form not necessarily presented to scale, with the only intention of facilitating convenience and clarity in explanation.

Figure 1:
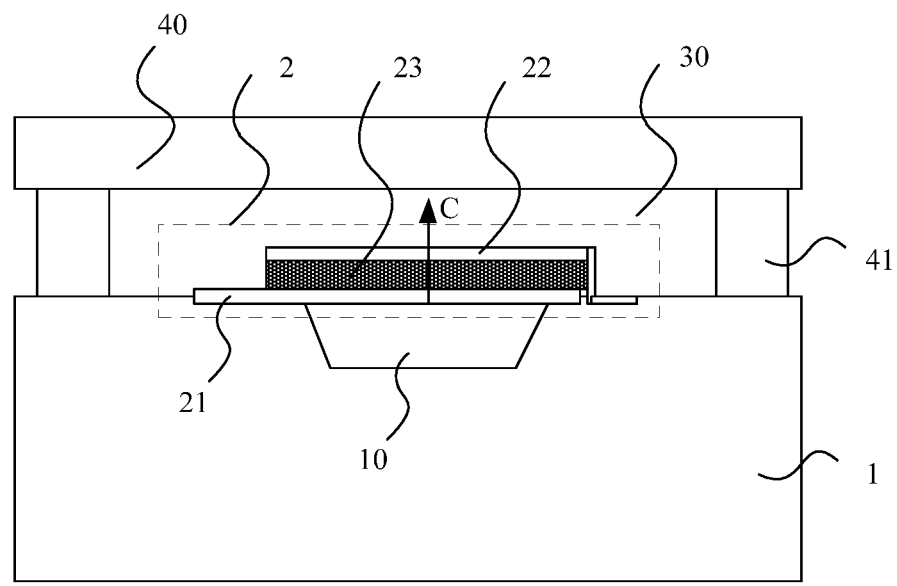
FIG. 1 is a schematic illustration of a vacuum-sealed film bulk acoustic resonator (FBAR)
Figure 2:
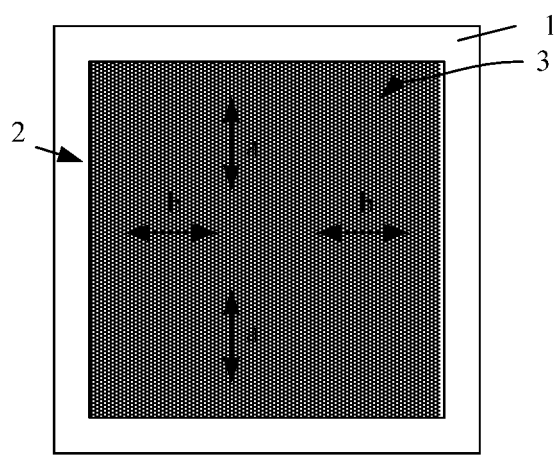
FIG. 2 is a top view of the FBAR of FIG. 1.

After long-term research, the inventors have found that in the structure as shown in FIG. 2, as boundaries 3 of the bottom cavity 10 in the substrate 1 and the resonator sheet 2 are provided by opposite parallel sides, in operation of the FBAR, the resonator sheet 2 vibrates and produces waves in both the directions of a and b. These waves will be reflected when reaching the boundaries 3, thus inducing strong parasitic waves that will lead a deteriorated FBAR Q factor. Hence, the applicant proposes a novel solution in which cavities are provided on both top and bottom sides of the resonator sheet 2 in such a manner that an overlap of their projections in the direction normal to the substrate is a polygon with non-parallel sides. In this way, the performance in parasitic wave crosstalk can be effectively enhanced.

Embodiment 1

Figure 3:
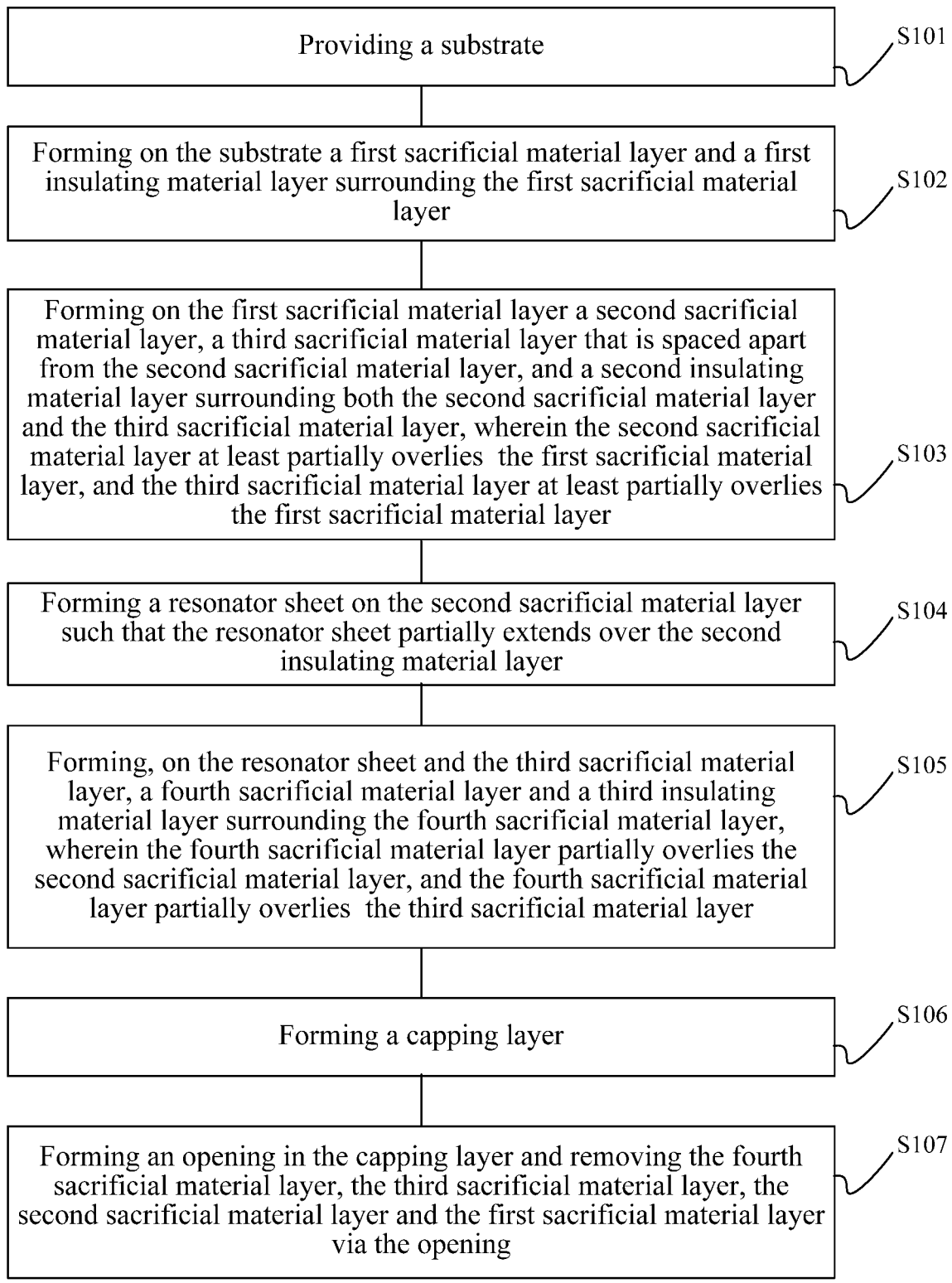
FIG. 3 shows a flow chart of a method of fabricating an FBAR according to various embodiments of the present disclosure.
Figure 13:
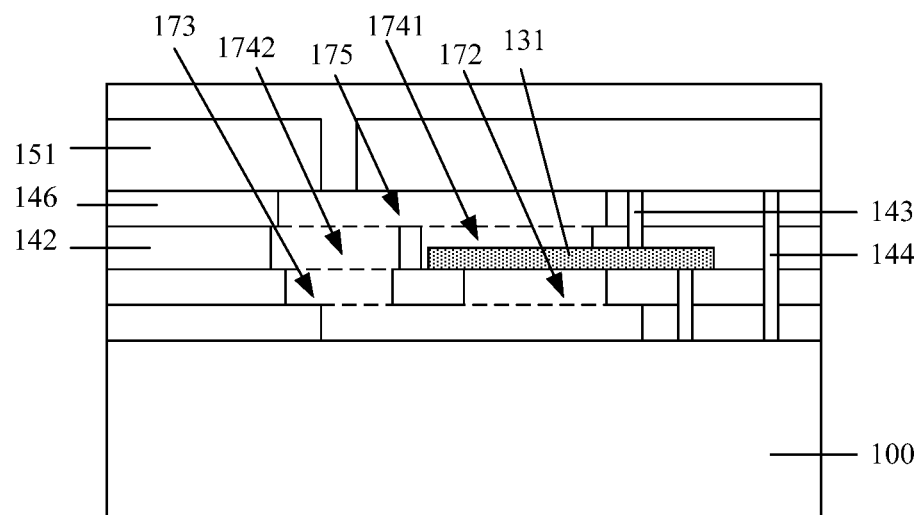
FIGS. 13 and 14 are schematic illustrations of two types of FBARs according to various embodiments of the present disclosure.
Figure 14:
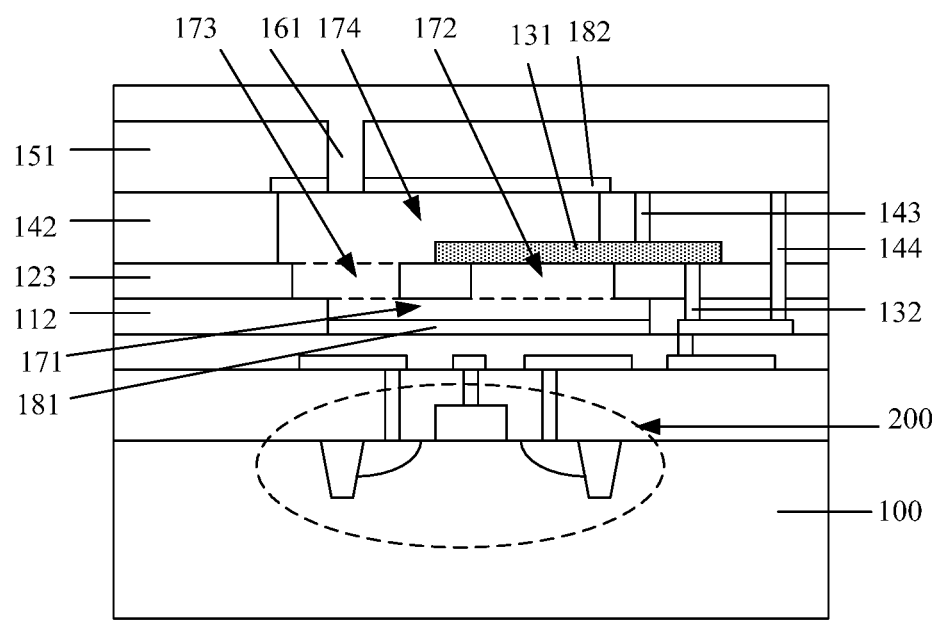

FBARs and methods of fabricating them according to various embodiments of the present disclosure will be described in detail with reference to FIG. 3, in conjunction with FIGS. 4a to 14, wherein FIG. 3 shows a flow chart of a method of fabricating an FBAR according to various embodiments of the present disclosure; FIGS. 4a to 12 are schematics depicting structures formed in the process of fabricating the FBAR; FIG. 13 is a schematic illustration of one type of FBAR according to various embodiments of the present disclosure; and FIG. 14 is a schematic illustration of another type of FBAR according to various embodiments of the present disclosure.

Figure 4A:
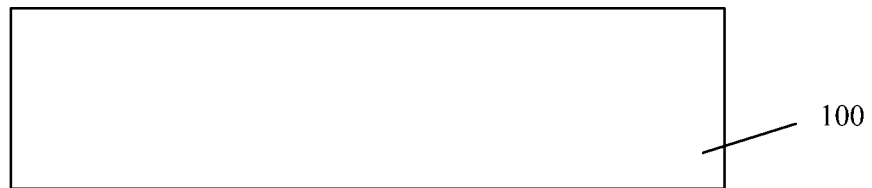
FIGS. 4a, 4b, 5a, 5b, 6, 7, 8a-8c, 9a, 9b, and 10-12 are schematics depicting structures formed in the process of fabricating the FBAR according to various embodiments of the present disclosure.
Figure 4B:
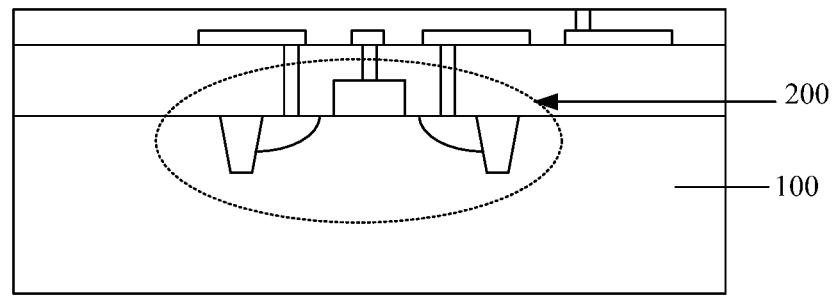

As shown in FIG. 3, the FBAR fabrication method according to the disclosure includes:

At first, in step S101, with reference to FIG. 4a, a substrate 100 is provided. Selection of the substrate 100 is well known to those skilled in the art. For example, the substrate 100 can be selected as a monocrystalline silicon substrate, a silicon-germanium substrate, a germanium substrate or a substrate made of another semiconductor material known to those skilled in the art. When needed, the substrate 100 may contain buried layers or similar structures, or well regions formed by ion implantation. As another example of the disclosure, the substrate 100 is preferably selected as one on which active CMOS devices and electrical interconnects have been formed. In particular, as shown in FIG. 4b, a PN junction-containing semiconductor device 200, such as a CMOS device may be formed on the substrate 100 in advance, followed by fabrication of interconnects in electrical connection with the PN junction-containing semiconductor device 200, such as CMOS plugs, horizontal interconnects, etc.

Figure 5A:
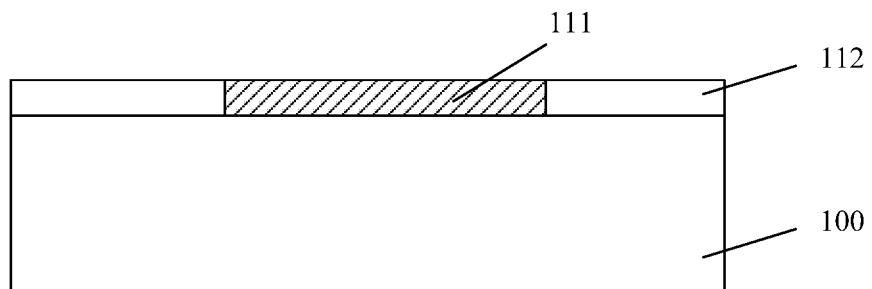

Next, in step S102, with reference to FIG. 5a, the method proceeds with the structure of FIG. 4a, a first sacrificial material layer 111 and a first insulating material layer 112 surrounding the first sacrificial material layer 111 are formed on the substrate 100. Specifically, for example, the first insulating material layer 112 may be first formed and then etched so that an opening is formed therein. The first sacrificial material may be then deposited in the opening and on the first insulating material layer 112. Subsequently, the first sacrificial material deposited outside the opening may be removed, leaving the first sacrificial material layer 111 filled in the opening. Alternatively, the first sacrificial material layer 111 may be first formed by patterning, followed by deposition of the first insulating material over the substrate 100 and the patterned first sacrificial material layer 111. A planarization process may be then carried out to expose the first sacrificial material layer 111, thereby forming the first insulating material layer 112. The first insulating material may be a silicide such as silicon nitride, silicon oxynitride or silicon oxide. The first sacrificial material may be, for example, a silicon oxide, carbon-rich dielectric layer, germanium, hydrocarbon polymer or amorphous carbon, with amorphous carbon being preferred in this embodiment. It is noted that the first sacrificial material and the first insulating material are not limited to those enumerated ones, as they may also be other materials known to those skilled in the art. It will be appreciated that, in the structure of FIG. 4b, the first sacrificial material layer 111 and the first insulating material layer 112 surrounding the first sacrificial material layer 111 are formed on said interconnects.

Figure 5B:
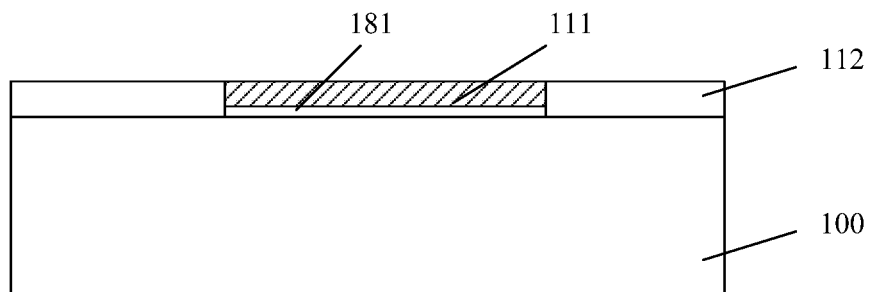

In addition, as shown in FIG. 5b, prior to the formation of the first sacrificial material layer 111, a bottom electrical shield layer 181 may be formed to block external electromagnetic interference from the cavities to be subsequently formed.

Figure 6:
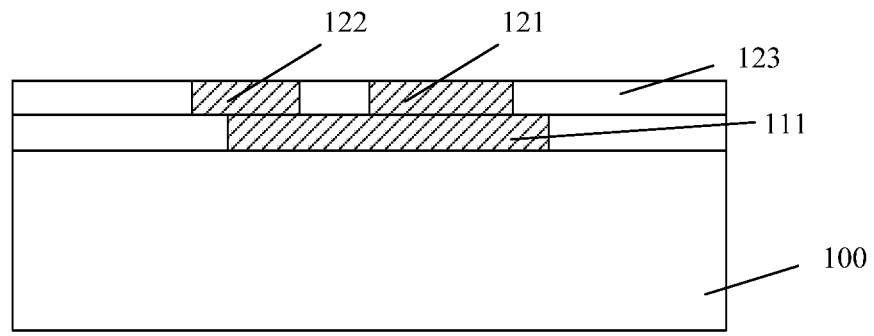

Afterward, in step S103, with reference to FIG. 6, on the first sacrificial material layer 111, are formed a second sacrificial material layer 121, a third sacrificial material layer 122 that is spaced apart from the second sacrificial material layer 121, and a second insulating material layer 123 surrounding both the second sacrificial material layer 121 and the third sacrificial material layer 122. The second sacrificial material layer 121 at least partially overlies the first sacrificial material layer 111. The third sacrificial material layer 122 also at least partially overlies the first sacrificial material layer 111. Reference can be made to the above description in connection with step S102 for details about the formation of the second sacrificial material layer 121, the third sacrificial material layer 122 and the second insulating material layer 123 in this step, with the only additional feature that the second insulating material layer 123 separates the second sacrificial material layer 121 from the third sacrificial material layer 122. The second insulating material layer 123 may be formed from the same material as the first insulating material layer 112. Also, the second sacrificial material layer 121 and the third sacrificial material layer 122 may be formed from the same material as the first sacrificial material layer 111. For example, in this embodiment, the second sacrificial material layer 121 and the third sacrificial material layer 122 may preferably be formed from amorphous carbon. However, it should be appreciated that the second sacrificial material layer 121, the third sacrificial material layer 122 and the second insulating material layer 123 may also be formed from other materials known to those skilled in the art. In this step, preferably, the second sacrificial material layer 121 completely overlies the first sacrificial material layer 111. That is, a projection of the second sacrificial material layer 121 in the direction normal to the substrate 100 falls completely within the area of the first sacrificial material layer 111. This can facilitate the removal of the first sacrificial material layer 111 via a cavity remaining after the removal of the third sacrificial material layer 122, and can further facilitate the removal of the second sacrificial material layer 121 via a cavity remaining after the removal of the first sacrificial material layer 111. As the second sacrificial material layer 121 can be fully exposed by the cavity left after the removal of the first sacrificial material layer 111, it can be completely removed. This allows a cavity under a resonator sheet 131 (FIG. 7) to be fully opened without affecting performance of the device being fabricated. Herein, the cross-sectional shape of the second sacrificial material layer 121 along a direction parallel to the substrate 100 is not limited, and it may be irregular, rectangular, hexagonal, circular, etc. For example, in this embodiment, it is a random irregular shape. In addition, the cross-sectional shape of the third sacrificial material layer 122 along a direction parallel to the substrate 100 is also not limited, and it may be either circular or rectangular. In this embodiment, it is preferred to be circular so that the third sacrificial material layer 122 can be easily removed.

Figure 7:
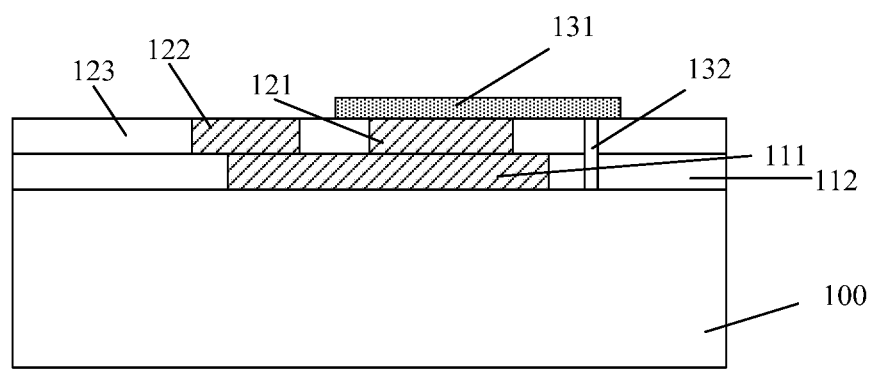

Subsequently, in step S104, with reference to FIG. 7, a resonator sheet 131 is formed which covers the second sacrificial material layer 121 and partially extends over the second insulating material layer 123. In a preferred implementation, a through hole (not shown in FIG. 7) extending through the second insulating material layer 123 and the first insulating material layer 112 is formed before the formation of the resonator sheet 131, and a first plug 132 is formed within the through hole. The first plug 132 also extends through the first insulating material layer 112 and the second insulating material layer 123, with one end in connection with the substrate (for example, implemented as a weld pad on the substrate) and the other end in connection with the resonator sheet to be subsequently fabricated. The resonator sheet 131 can be formed after the first plug 132 has been formed. The resonator sheet 131 includes, for example, a stack of a first electrode layer, a second electrode layer and a piezoelectric layer between the first electrode layer and the second electrode layer. The connection of the first plug 132 is accomplished at the first electrode layer. In a preferred implementation, the resonator sheet 131 covers entire of the second sacrificial material layer 121 but does not extend over any portion of the third sacrificial material layer 122. At the same time, the resonator sheet 131 extends over a portion of the second insulating material layer 123. In other implementations, the resonator sheet 131 may also cover a portion of the second sacrificial material layer 121. The formation of the resonator sheet 131 in this step can be accomplished using one of methods known in this art, so a description thereof is omitted herein. The cross-sectional shape of the resonator sheet 131 along a direction parallel to the substrate 100 is not limited, and it may be irregular, rectangular, circular, hexagonal, etc. Further, in order to enable the resonator sheet 131 to be supported after the removal of the second sacrificial material layer 121, the resonator sheet 131 is required to have a portion overlying the second insulating material layer 123.

Figure 8A:
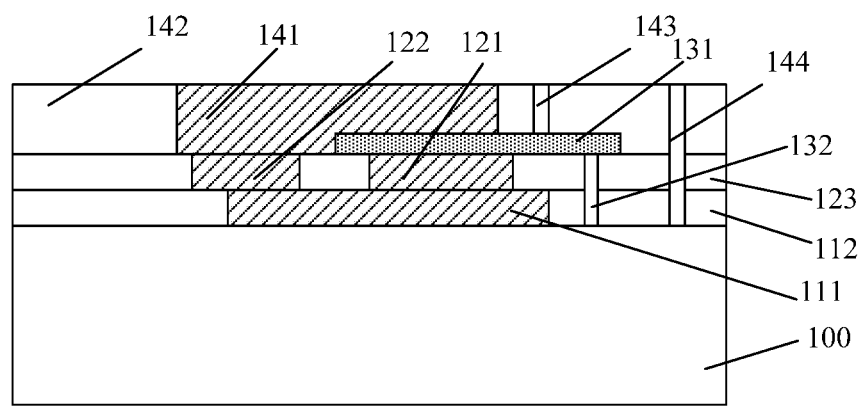

After that, in step S105, with reference to FIG. 8*a*, on the resonator sheet 131 and the third sacrificial material layer 122, are formed a fourth sacrificial material layer 141 and a third insulating material layer 142 surrounding the fourth sacrificial material layer 141. The fourth sacrificial material layer 141 overlaps a portion of the second sacrificial material layer 121. In a preferred implementation, the overlapped portion is a polygon 300 (i.e., the area demarcated by the dashed lines in FIG. 12) with non-parallel sides. The fourth sacrificial material layer 141 partially overlies the third sacrificial material layer 122. This allows the subsequent removal of the first sacrificial material layer 111, the second sacrificial material layer 121, the third sacrificial material layer 122 and the fourth sacrificial material layer 141 to be performed without forming an opening in the resonator sheet 131 which will impair the integrity of the resonator sheet 131. In order for the fourth sacrificial material layer 141 and the third sacrificial material layer 122 to be completely removed without leaving residues, as shown in FIG. 8*a*, the fourth sacrificial material layer 141 preferably covers the entire of the third sacrificial material layer 122. The complete removal of the third sacrificial material layer 122 can in turn enhance the complete removal of the second sacrificial material layer 121. In this embodiment, the fourth sacrificial material layer 141 is preferred to be a continuous integral structure so that it can be removed via an opening in the capping layer subsequently formed above it. Herein, the cross-sectional shape of the fourth sacrificial material layer 141 along a direction parallel to the substrate 100 is not limited, and it may be irregular, rectangular, hexagonal, circular, etc. For example, in this embodiment, it is a random irregular shape. In addition, in this embodiment, the polygonal overlapped portion 300 can be entirely projected onto the resonator sheet 131. In other words, the aforementioned polygonal overlap of the projections is inside the projection of the resonator sheet 131. Here, the polygonal overlapped portion refers to an area where the projections of the fourth sacrificial material layer 141 and the second sacrificial material layer 121 along the direction normal to the substrate 100 overlap or intersect each other, i.e., an intersection of the two projections.

In other embodiments, the portion of the second sacrificial material layer 121 overlapped by the fourth sacrificial material layer 141 may also be a polygon 300 which is not a polygon with non-parallel sides.

In this step, after the fourth sacrificial material layer 141 and the third insulating material layer 142 have been formed, a second plug 143 extending through the third insulating material layer 142 and a third plug 144 extending through the third insulating material layer 142, the second insulating material layer 123 and the first insulating material layer 112 may also be formed such that the second plug 143 is connected to the second electrode layer of the resonator sheet 131 and the third plug 144 is connected to the substrate. Similarly, the third insulating material layer 142 may be formed from the same material as the first insulating material layer 112, and the fourth sacrificial material layer 141 may be formed from the same material as the first sacrificial material layer 111. Of course, it is also possible that the third insulating material layer 142 and the first insulating material layer 112 are formed from different materials, and similarly, the fourth sacrificial material layer 141 and the first sacrificial material layer 111 may also be formed from distinct materials, with amorphous carbon being preferred in this embodiment.

Figure 8B:
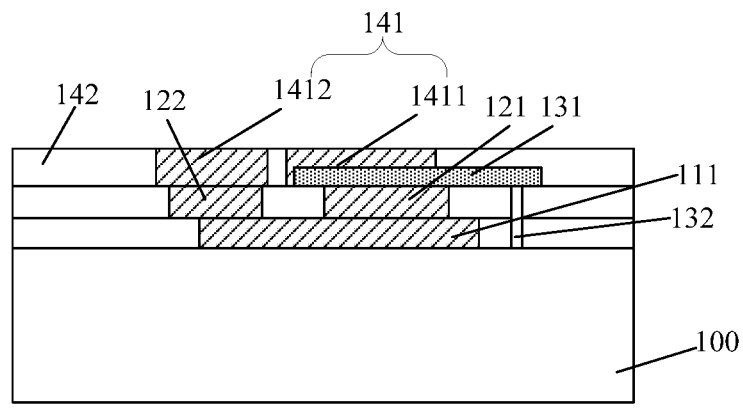
Figure 8C:
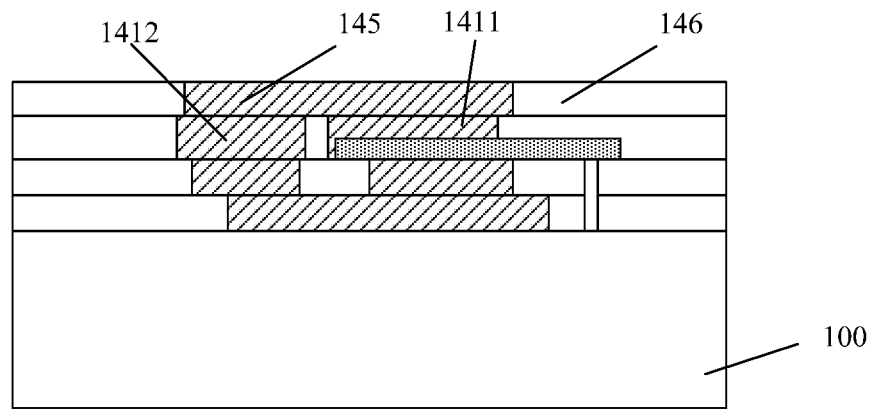

In another embodiment, it will be appreciated that the fourth sacrificial material layer includes a fifth sacrificial material layer and a sixth sacrificial material layer. Referring to FIGS. 8*b* and 8*c*, the fourth sacrificial material layer 141 includes the fifth sacrificial material layer 1411 and the sixth sacrificial material layer 1412 which is spaced apart from the fifth sacrificial material layer 1411. The fifth sacrificial material layer 1411 resides on the resonator sheet 131, and the sixth sacrificial material layer 1412 partially overlies the third sacrificial material layer 122. In addition, over the fifth sacrificial material layer 1411 and the sixth sacrificial material layer 1412, there are also a seventh sacrificial material layer 145 and a fourth insulating material layer 146 surrounding the seventh sacrificial material layer 145, wherein the seventh sacrificial material layer 145 partially overlies the sixth sacrificial material layer 1412 and partially overlies the fifth sacrificial material layer 1411. The portion of the second sacrificial material layer 121 overlapped by the fifth sacrificial material layer 1411 is a polygon 300 with non-parallel sides. Therefore, the numbers of sacrificial material layers and insulating material layers are not limited to those described above and can be flexibly selected or changed according to practical needs by those skilled in the art.

Figure 9A:
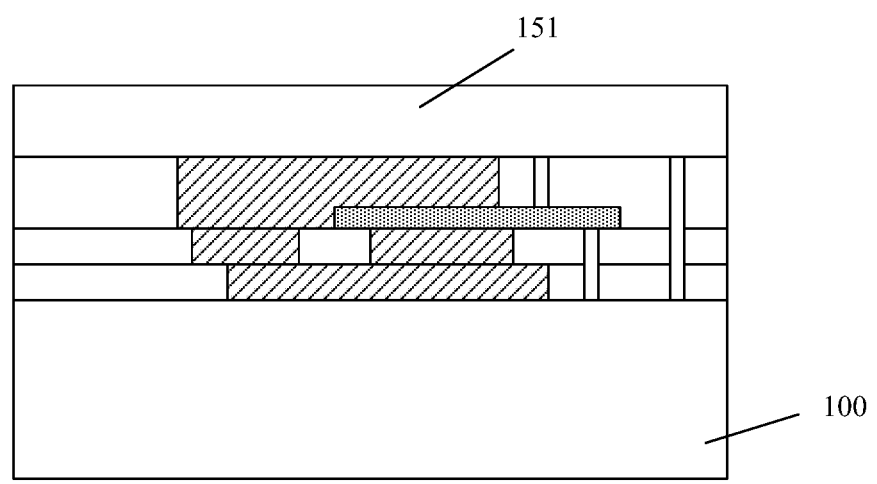

Thereafter, in step S106, referring to FIG. 9*a*, with the structure of FIG. 8*a* resulting from step S105 as an example, a capping layer 151 is formed.

Figure 9B:
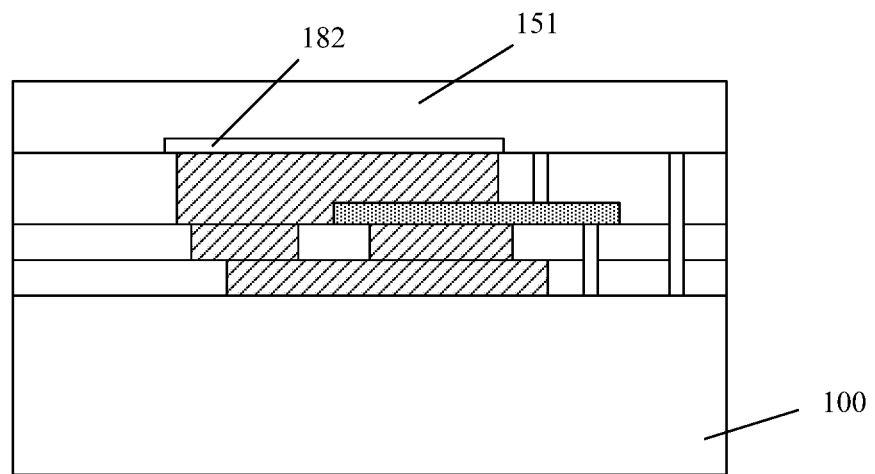

Additionally, as shown in FIG. 9*b*, a top electrical shield layer 182 can be formed prior to the formation of the capping layer 151 in order to block external electromagnetic interference from the cavities to be subsequently formed.

Figure 10:
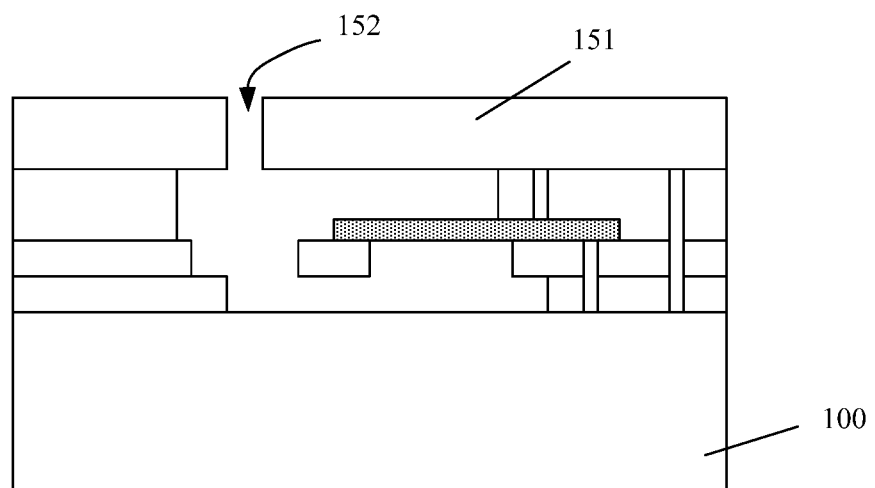

After that, in step S107, with reference to FIG. 10, an opening 152 is formed in the capping layer 151. The first sacrificial material layer, the second sacrificial material layer, the third sacrificial material layer and the fourth sacrificial material layer (as well as the fifth sacrificial material layer, the sixth sacrificial material layer and the seventh sacrificial material layer, if present) are removed via the opening 152. In particular, in this embodiment, the removal of the first sacrificial material layer, the second sacrificial material layer, the third sacrificial material layer and the fourth sacrificial material layer can be accomplished using an ashing technique in which the amorphous carbon is ashed by oxygen at a high temperature. The connection of the second sacrificial material layer to the third sacrificial material layer via the first sacrificial material layer and the interconnection of the third sacrificial material layer and the fourth sacrificial material layer allow the second sacrificial material layer to be effectively removed even though it is not exposed by an opening in the resonator sheet. This avoids conventional problem that residues remain due to removal via an opening formed by incomplete coverage of the second sacrificial material layer by the resonator sheet or otherwise, thereby resulting in a significant improvement in the performance of the device being fabricated and simplification of the fabrication process. Further, referring to FIG. 11, a first vacuum sealing plug 161 is formed, which blocks the opening 152, so that a first cavity 171, a second cavity 172, a third cavity 173 and a fourth cavity 174 are formed, which correspond to the first sacrificial material layer, the second sacrificial material layer, the third sacrificial material layer and the fourth sacrificial material layer, respectively.

Figure 12:
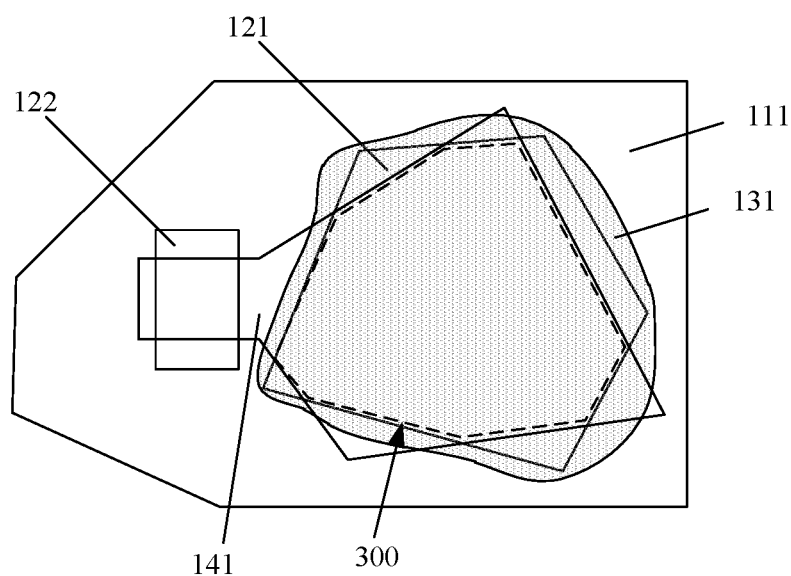

With combined reference to FIG. 12, with the first cavity 171, the second cavity 172, the third cavity 173 and the fourth cavity 174 being formed, boundaries of the fourth cavity 174 and the second cavity 172 delimit the polygon 300 with non-parallel sides, which is, for example, an octagon in this embodiment of the disclosure. In operation of the resulting film bulk acoustic resonator, reflections of waves occurring at the non-parallel sides of the polygon 300 will not cause strong parasitic waves. Therefore, crosstalk of such parasitic waves will be significantly reduced.

Embodiment 2

A method according to another embodiment of the present disclosure may include the steps of:
providing a substrate;
forming on the substrate a first sacrificial material layer and a first insulating material layer surrounding the first sacrificial material layer;
forming a resonator sheet on the first sacrificial material layer such that the resonator sheet partly extends over the first insulating material layer;
forming on the resonator sheet a second sacrificial material layer and a second insulating material layer surrounding the second sacrificial material layer, wherein the second sacrificial material layer partially overlies the first sacrificial material layer, and an overlap of projections of the second sacrificial material layer and the first sacrificial material layer along a direction normal to the substrate is a polygon with non-parallel sides which falls completely within the area of the resonator sheet;
forming a capping layer; and
forming an opening in the capping layer and removing the first sacrificial material layer and the second sacrificial material layer via the opening.

This embodiment is essentially similar to Embodiment 1 while differing therefrom in that there is only one sacrificial material layer (i.e., the first sacrificial material layer) under the resonator sheet. Those skilled in the art can make reference to the description of Embodiment 1 for details in the method according to this embodiment. In this embodiment, the resonator sheet may not completely cover the first sacrificial material layer so that the sacrificial material layer is partially exposed for the removal process. Alternatively, a through hole can be formed in the resonator sheet using an etching technique so as to provide a path for the removal process.

Figure 11:
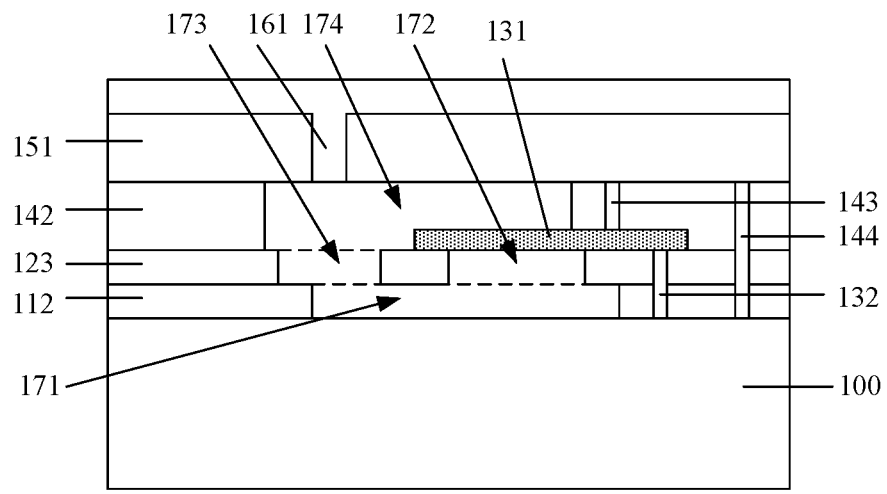

As shown in FIG. 11, the film bulk acoustic resonator made by the method according to Embodiment 1 includes:
the substrate 100;
the first insulating material layer 112 on the substrate 100 and the first cavity 171 in the first insulating material layer 112;
the second insulating material layer 123 on the insulating material layer 112 and the second cavity 172 and third cavity 173 that are formed in the second insulating material layer 123 and spaced apart from each other, wherein the second cavity 172 and the third cavity 173 both communicate with the first cavity 171;
the resonator sheet 131 that covers the second cavity 172 and partially extends over the second insulating material layer 123;
the third insulating material layer 142 formed on both the second insulating material layer 123 and the resonator sheet 131 and the fourth cavity 174 in the third insulating material layer 142, wherein the fourth cavity 174 communicates with the third cavity 173 and the fourth cavity 174 partially overlies the second cavity 172; and
the capping layer 151 formed over the third insulating material layer 142, wherein the capping layer 151 seals all of the cavities via the first vacuum sealing plug 161.

The resonator sheet 131 includes the stacked first electrode layer, second electrode layer and piezoelectric layer sandwiched between the first electrode layer and the second electrode layer. The first plug 132 extends through the first insulating material layer 112 and the second insulating material layer 123, one end of the first plug 132 is in connection with the substrate 100 and the other end is in connection with the first electrode layer. The second plug 143 is in connection with the second electrode layer and extends through the third insulating material layer 142. The third plug 144 extends through the first insulating material layer 112, the second insulating material layer 123 and the third insulating material layer 142 in order to allow external connection of the substrate.

Referring to FIG. 13, it will be appreciated that the fourth cavity may include a fifth cavity 1741 and a sixth cavity 1742 that is spaced apart from the fifth cavity 1741. The fifth cavity 1741 may overlie the resonator sheet 131, with the sixth cavity 1742 in communication with the third cavity 173. In addition, there may also be a seventh cavity 175 over the fifth cavity 1741 and the sixth cavity 1742. The seventh cavity 175 may communicate with both the fifth cavity 1741 and the sixth cavity 1742. Accordingly, the seventh cavity 175 may be formed in the fourth insulating material layer 146.

As specified above, in the inventive FBAR, as projections of the fourth cavity and the second cavity, which are formed on both sides of the resonator sheet, along the direction normal to the substrate overlap at a polygonal overlap area with non-parallel sides, the likelihood of boundary reflections of transverse parasitic waves causing standing wave resonance in the FBAR is significantly lowered, thereby mitigating crosstalk from the parasitic waves and minimizes its impact on the FBAR Q factor.

As shown in FIG. 14, in the inventive FBAR, an active CMOS device and interconnects can be integrated. Specifically, a PN junction-containing semiconductor device 200, such as a CMOS device, as well as interconnects electrically connecting the semiconductor device 200, such as CMOS plugs and horizontal interconnects, may be formed on the substrate, wherein the first sacrificial material layer and the first insulating material layer surrounding the first sacrificial material layer overlies the interconnects, with the rest the same as, for example, in FIG. 11 and thus not needing repeated description. The integration of the FBAR with CMOS circuitry can effectively enhance the integration performance and reliability of the whole system.

Further, beneath the bottom cavity under the resonator sheet 131 and above the top cavity on the resonator sheet 131, for example, beneath the bottom of the first cavity 171 and above the top of the fourth cavity 174, the bottom electrical shield layer 181 and the top electrical shield layer 182 may respectively be formed and be both grounded (not shown) in order to block external electromagnetic interference away from the two cavities.

Obviously, those skilled in the art may make various modifications and alterations without departing from the spirit and scope of the disclosure. It is therefore intended that the disclosure be construed as including all such modifications and alterations insofar as they fall within the scope of the appended claims or equivalents thereof.

What is claimed is:

1. A film bulk acoustic resonator, comprising:
   a substrate;
   a first insulating material layer on the substrate, the first insulating material layer containing a first cavity;
   a second insulating material layer on the first insulating material layer, the second insulating material layer containing a second cavity and a third cavity spaced apart from the second cavity, the second cavity and the third cavity both in communication with the first cavity;
   a resonator sheet covering the second cavity and partially extending over the second insulating material layer;
   a third insulating material layer over the second insulating material layer and the resonator sheet, the third insulating material layer containing a fourth cavity, the fourth cavity in communication with the third cavity, the fourth cavity partially overlapping the second cavity; and
   a capping layer on the third insulating material layer.

2. The resonator according to claim 1, wherein projections of the fourth cavity and the second cavity along a direction normal to the substrate overlap at a polygonal area with non-parallel sides.

3. The resonator according to claim 1, wherein the resonator sheet comprises a stack of a first electrode layer, a second electrode layer and a piezoelectric layer between the first electrode layer and the second electrode layer.

4. The resonator according to claim 1, wherein:
   the fourth cavity comprises a fifth cavity and a sixth cavity spaced apart from the fifth cavity, the fifth cavity overlying the resonator sheet, and the sixth cavity in communication with the third cavity.

5. The resonator according to claim 4, wherein:
   a seventh cavity is formed above the fifth cavity and the sixth cavity, the seventh cavity in communication with each of the fifth cavity and the sixth cavity, and
   projections of the fifth cavity and the second cavity along a direction normal to the substrate overlap at a polygonal area with non-parallel sides.

6. The resonator according to claim 1, further comprising:
   at least one PN junction-containing semiconductor transistor formed on the substrate, wherein the first insulating material layer overlies the at least one PN junction-containing semiconductor transistor.

7. The resonator according to claim 1, further including:
   a first vacuum sealing plug, including a plug portion passing through the capping layer and over the fourth cavity.

8. The resonator according to claim 1, wherein:
   a projection of the second cavity along a direction normal to the substrate falls within the first cavity.

9. The resonator according to claim 1, wherein:
   the fourth cavity covers an entirety of the third cavity.

10. The resonator according to claim 1, wherein:
    each of the first insulating material layer, the second insulating material layer, the third insulating material layer, and the capping layer includes a silicide layer.

11. The resonator according to claim 1, further including:
    a bottom electrical shield layer over the substrate at a bottom of the first cavity.

12. The resonator according to claim 1, further including:
    a top electrical shield layer on the third insulating material layer covering the fourth cavity, and under the capping layer.

13. The resonator according to claim 7, further including:
    a top electrical shield layer on the third insulating material layer covering the fourth cavity, under the capping layer and surrounding the plug portion of the first vacuum sealing plug.

14. A film bulk acoustic resonator, comprising:
    a substrate;
    a first insulating material layer on the substrate, the first insulating material layer containing a first cavity;
    a resonator sheet on the first insulating material layer and at least partially extending over the first cavity;
    a second insulating material layer on the resonator sheet and the first insulating material layer, the second insulating material layer containing a second cavity, wherein the second cavity partially overlies the first cavity, and projections of the second cavity and the first cavity along a direction normal to the substrate overlap at a polygonal area with non-parallel sides; and
    a capping layer on the second insulating material layer.

15. The resonator according to claim 14, wherein the resonator sheet comprises a stack of a first electrode layer, a second electrode layer and a piezoelectric layer between the first electrode layer and the second electrode layer.

16. The resonator according to claim 14, further comprising:
    at least one PN junction-containing semiconductor transistor formed on the substrate, wherein the first insulating material layer overlies the at least one PN junction-containing semiconductor transistor.

17. The resonator according to claim 14, further including:
    a first vacuum sealing plug, including at least a plug portion passing through the capping layer and over the second cavity.

18. The resonator according to claim 14, wherein:
    each of the first insulating material layer, the second insulating material layer, and the capping layer includes a silicide layer.

19. The resonator according to claim 14, further including:
    a bottom electrical shield layer over the substrate at a bottom of the first cavity.

20. The resonator according to claim 14, further including:
    a top electrical shield layer on the second insulating material layer covering the second cavity and under the capping layer.

* * * * *